United States Patent
Wu et al.

(10) Patent No.: US 8,952,484 B2
(45) Date of Patent: Feb. 10, 2015

(54) NON-VOLATILE MEMORY HAVING ISOLATION STRUCTURES IN AND ABOVE A SUBSTRATE AND MANUFACTURING METHOD THEREOF

(75) Inventors: Guan-Wei Wu, Hsinchu (TW); I-Chen Yang, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 434 days.

(21) Appl. No.: 12/949,092

(22) Filed: Nov. 18, 2010

(65) Prior Publication Data
US 2012/0126307 A1     May 24, 2012

(51) Int. Cl.
| | | |
|---|---|---|
| *H01L 21/70* | (2006.01) | |
| *H01L 29/788* | (2006.01) | |
| *H01L 29/792* | (2006.01) | |
| *H01L 21/8238* | (2006.01) | |
| *H01L 21/336* | (2006.01) | |
| *H01L 21/762* | (2006.01) | |

(52) U.S. Cl.
CPC ........ *H01L 29/792* (2013.01); *H01L 21/76232* (2013.01)
USPC ........... 257/506; 257/321; 257/324; 257/501; 257/E29.018; 257/E29.02; 438/221; 438/257; 438/263; 438/264; 438/295; 438/296

(58) Field of Classification Search
USPC ......................................... 257/501, E29.018
See application file for complete search history.

(56) References Cited

U.S. PATENT DOCUMENTS

| | | | | |
|---|---|---|---|---|
| 6,177,317 | B1 * | 1/2001 | Huang et al. | 438/263 |
| 2007/0158780 | A1 * | 7/2007 | Chang | 257/500 |
| 2008/0061333 | A1 * | 3/2008 | Hidaka | 257/295 |
| 2010/0155816 | A1 * | 6/2010 | Cheng et al. | 257/324 |

FOREIGN PATENT DOCUMENTS

TW      355835      4/1999

OTHER PUBLICATIONS

Defintion of At. (n. d.) The American Heritage® Dictionary of the English Language, Fourth Edition. (2003). Retrieved Oct. 27, 2013 from http://www.thefreedictionary.com/AT.*
"Office Action of Taiwan Counterpart Application", issued on Jul. 3, 2013, p. 1-p. 9, in which the listed reference was cited.

* cited by examiner

*Primary Examiner* — Michael Jung
(74) *Attorney, Agent, or Firm* — J.C. Patents (57) ABSTRACT

A non-volatile memory and a manufacturing method thereof are provided. The non-volatile memory includes a substrate, a gate structure, a first doped region, a second doped region and a pair of isolation structures. The gate structure is disposed on the substrate. The gate structure includes a charge storage structure, a gate and spacers. The charge storage structure is disposed on the substrate. The gate is disposed on the charge storage structure. The spacers are disposed on the sidewalls of the gate and the charge storage structure. The first doped region and the second doped region are respectively disposed in the substrate at two sides of the charge storage structure and at least located under the spacers. The isolation structures are respectively disposed in the substrate at two sides of the gate structure.

12 Claims, 10 Drawing Sheets

NON-VOLATILE MEMORY HAVING ISOLATION STRUCTURES IN AND ABOVE A SUBSTRATE AND MANUFACTURING METHOD THEREOF

BACKGROUND OF THE INVENTION

1. Field of the Invention

The invention relates to a non-volatile memory and a manufacturing method thereof. More particularly, the invention relates to a non-volatile memory capable of preventing second bit effect and program disturbance and a manufacturing method thereof.

2. Description of Related Art

Having the advantage of saving the stored data after the power is turned off, non-volatile memory is required in many electrical appliances for the normal operation of electrical appliances. Specifically, flash memory is a memory device widely adopted in personal computers and electronic apparatuses as flash memory is capable of performing operations such as data storage, reading, and erasing.

Nitride-based flash memory is one of the conventional non-volatile memories. In nitride-based flash memory, a charge capture structure constituted by oxide layer-nitride layer-oxide layer (that is, the well-known ONO layer) is capable of storing 2-bit data. Generally, 2-bit data is stored respectively on the left side (that is, the left bit) or the right side (that is, the right bit) of the nitride layer in the charge capture structure.

However, the nitride-based flash memory includes the second bit effect. That is, the left bit is affected by the right bit when being read, or the right bit is affected by the left bit when being read. In addition, with the gradual reduction of memory size, the length of the channel is also reduced, such that the second bit effect is further worsened. The operation window and device performance of the memory is affected as a result. Moreover, the distances between the devices are also shortened as the size of the memory is reduced. Thus, the program disturbance may also occur when the adjacent memory is programmed.

SUMMARY OF THE INVENTION

One embodiment of the invention provides a non-volatile memory which can prevent the occurrence of the second bit effect and the program disturbance during operation.

One embodiment of the invention further provides a manufacturing method of a non-volatile memory, where the method can manufacture a non-volatile memory having a larger operation window.

One embodiment of the invention provides a non-volatile memory including a substrate, a gate structure, a first doped region, a second doped region, and a pair of isolation structures. The gate structure is disposed on the substrate. The gate structure includes a charge storage structure, a gate, and a spacer. The charge storage structure is disposed on the substrate. The gate is disposed on the charge storage structure. The spacer is disposed on sidewalls of the gate and the charge storage structure. The first doped region and the second doped region are disposed in the substrate at two sides of the charge storage structure respectively and at least located under the spacer. The pair of isolation structures is disposed in the substrate at two sides of the gate structure respectively.

According to the non-volatile memory in one embodiment of the invention, the first doped region and the second doped region are located between the pair of isolation structures, for example, and a depth of the pair of isolation structures is greater than a depth of the first doped region and the second doped region.

According to the non-volatile memory in one embodiment of the invention, the first doped region and the second doped region surround one of the pair of isolation structures respectively, for example, and a depth of the first doped region and the second doped region is greater than a depth of the pair of isolation structures.

According to the non-volatile memory in one embodiment of the invention, the charge storage structure includes a first dielectric layer, a charge storage layer, and a second dielectric layer. The first dielectric layer is disposed on the substrate. The charge storage layer is disposed on the first dielectric layer. The second dielectric layer is disposed on the charge storage layer.

According to the non-volatile memory in one embodiment of the invention, a material of the charge storage layer includes, for instance, a nitride or a high dielectric constant material.

According to the non-volatile memory in one embodiment of the invention, the gate structure includes a tunneling dielectric layer, a floating gate, an inter-gate dielectric layer and a control gate. The tunneling dielectric layer is disposed on the substrate. The floating gate is disposed on the tunneling dielectric layer. The inter-gate dielectric layer is disposed on the floating gate. The control gate is disposed on the inter-gate dielectric layer. The spacer is disposed on sidewalls of the tunneling dielectric layer, the floating gate, the inter-gate dielectric layer and the control gate.

According to the non-volatile memory in one embodiment of the invention, the inter-gate dielectric layer, for example, is a composite structure constituted by oxide layer/nitride layer/oxide layer.

One embodiment of the invention provides a manufacturing method of a non-volatile memory. In this method, a substrate is first provided. A charge storage structure and a gate are formed on the substrate. A spacer is formed on sidewalls of the charge storage structure and the gate. A doped region is formed in the substrate at two sides of the charge storage structure. A trench is formed in the substrate at the two sides of the gate and the spacer. An isolation structure is formed in the trench.

According to the manufacturing method of the non-volatile memory in one embodiment of the invention, the trench, for example, has a depth of the trench is greater than a depth of the doped region.

According to the manufacturing method of the non-volatile memory in one embodiment of the invention, the doped region, for example, surrounds the trench, and has a depth of the doped region is greater than a depth of the trench.

According to the manufacturing method of the non-volatile memory in one embodiment of the invention, the doped region is formed by performing a doping process, for instance.

According to the manufacturing method of the non-volatile memory in one embodiment of the invention, a formation of the isolation structure includes, for example, the following. An insulation material layer is formed on the substrate. The insulation material layer covers the gate and the spacer and fills the trench. A planarization process is performed to remove a portion of the insulation material layer until the gate is exposed.

One embodiment of the invention provides a non-volatile memory including a substrate, two gate structures, a doped region, and a isolation structure. The gate structures are disposed on the substrate. Each of the gate structures includes a charge storage structure, and a gate. The charge storage structure is disposed on the substrate. The gate is disposed on the charge storage structure. The doped region is disposed in the substrate between two gate structure. The isolation structures is disposed in the doped region.

According to the non-volatile memory in one embodiment of the invention, a depth of the isolation structure is greater than a depth of the doped region, for example.

According to the non-volatile memory in one embodiment of the invention, a depth of the doped region is greater than a depth of the isolation structure, for example.

According to the non-volatile memory in one embodiment of the invention, each of the gate structures includes a tunneling dielectric layer, a floating gate, an inter-gate dielectric layer and a control gate. The tunneling dielectric layer is disposed on the substrate. The floating gate is disposed on the tunneling dielectric layer. The inter-gate dielectric layer is disposed on the floating gate. The control gate is disposed on the inter-gate dielectric layer.

According to the non-volatile memory in one embodiment of the invention, each of the gate structures further includes a spacer disposed on sidewalls of the tunneling dielectric layer, the floating gate, the inter-gate dielectric layer and the control gate, for example.

According to the non-volatile memory in one embodiment of the invention, each of the gate structures further comprises a spacer disposed on a sidewall of each of the gate and the charge storage structure, for example.

In light of the foregoing, in the embodiments of the invention, when the doped regions adopted as the source region and the drain region are formed, the gate and the spacer are utilized as a mask. Therefore, when the dopant is implanted into the substrate, the spacer becomes a buffer region to the implanted dopant diffusion. Some of the dopant diffuses underneath the spacer instead of merely diffusing underneath the charge storage structure. The length between the source region and the drain region (that is, the channel length of the memory) is thus effectively prevented from shortening, so that the second bit effect generated during the operation of the memory is avoided.

Further, in the embodiments of the invention, since the isolation structures are disposed in the substrate at the two sides of the gate structure, the program disturbance is prevented effectively when programming the non-volatile memory.

It should be noted that the above description and the detailed illustration below are merely exemplary and the invention is not limited thereto.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
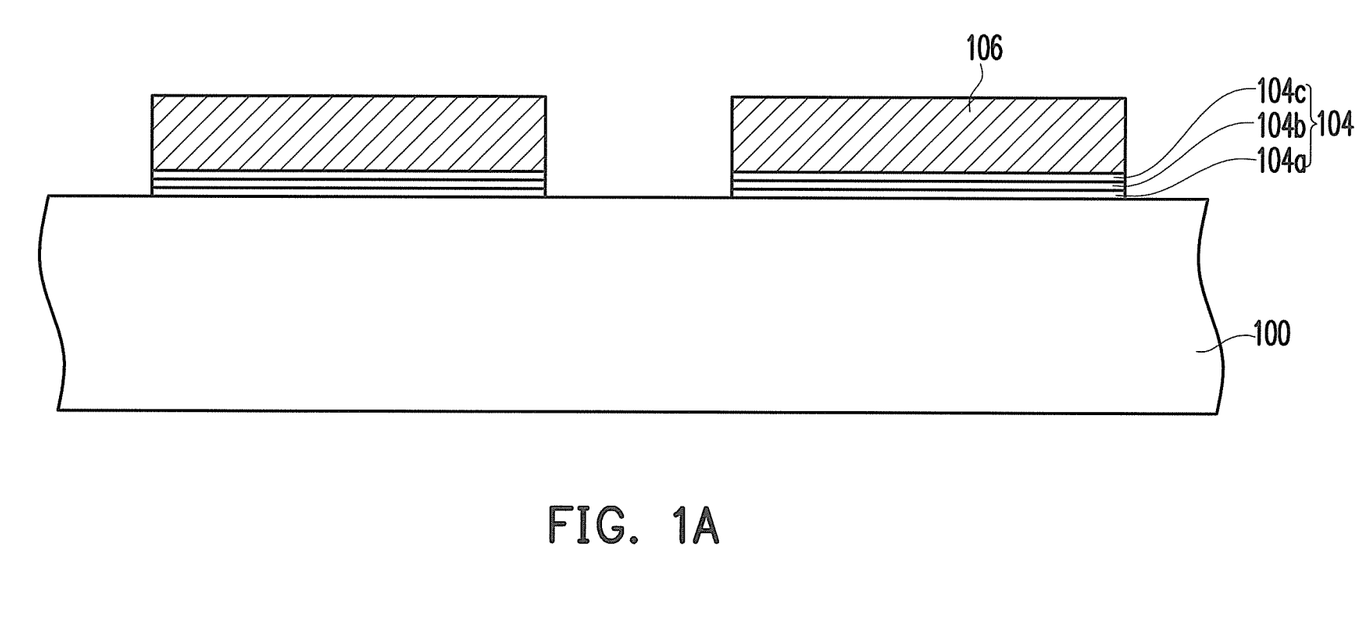
FIGS. 1A to 1D are cross-sectional views of a manufacturing flow chart of a non-volatile memory illustrated according to an embodiment of the invention.

FIGS. 1A to 1D are cross-sectional views of a manufacturing flow chart of a non-volatile memory illustrated according to an embodiment of the invention. Referring to FIG. 1A, a substrate 100 is provided. The substrate 100 is, for example, a silicon substrate or a silicon on insulator (SOI) substrate. A charge storage structure 104 and a gate 106 are formed on the substrate 100 sequentially. The charge storage structure 104 is a composite structure constituted by a dielectric layer 104a, a charge storage layer 104b, and a dielectric layer 104c. The dielectric layers 104a, 104c are manufactured using, for instance, an oxide. The charge storage layer 104b is manufactured using, for example, a nitride or a high dielectric constant material (i.e. $HfO_2$, $TiO_2$, $ZrO_2$, $Ta_2O_5$ or $Al_2O_3$). The dielectric layer 104a is adopted as a tunneling dielectric layer. The dielectric layer 104c is applied as a charge barrier layer. The gate 106 is manufacture by, for example, doped polysilicon. A formation of the charge storage structure 104 and the gate 106 includes the following, for instance. A first layer dielectric material layer, a charge storage material layer, a second layer dielectric material layer, and a gate material layer are deposited sequentially on the substrate 100. A patterning process is performed to pattern the gate material layer, the second layer dielectric material layer, the charge storage material layer, and the first layer dielectric material layer.

Figure 1B:
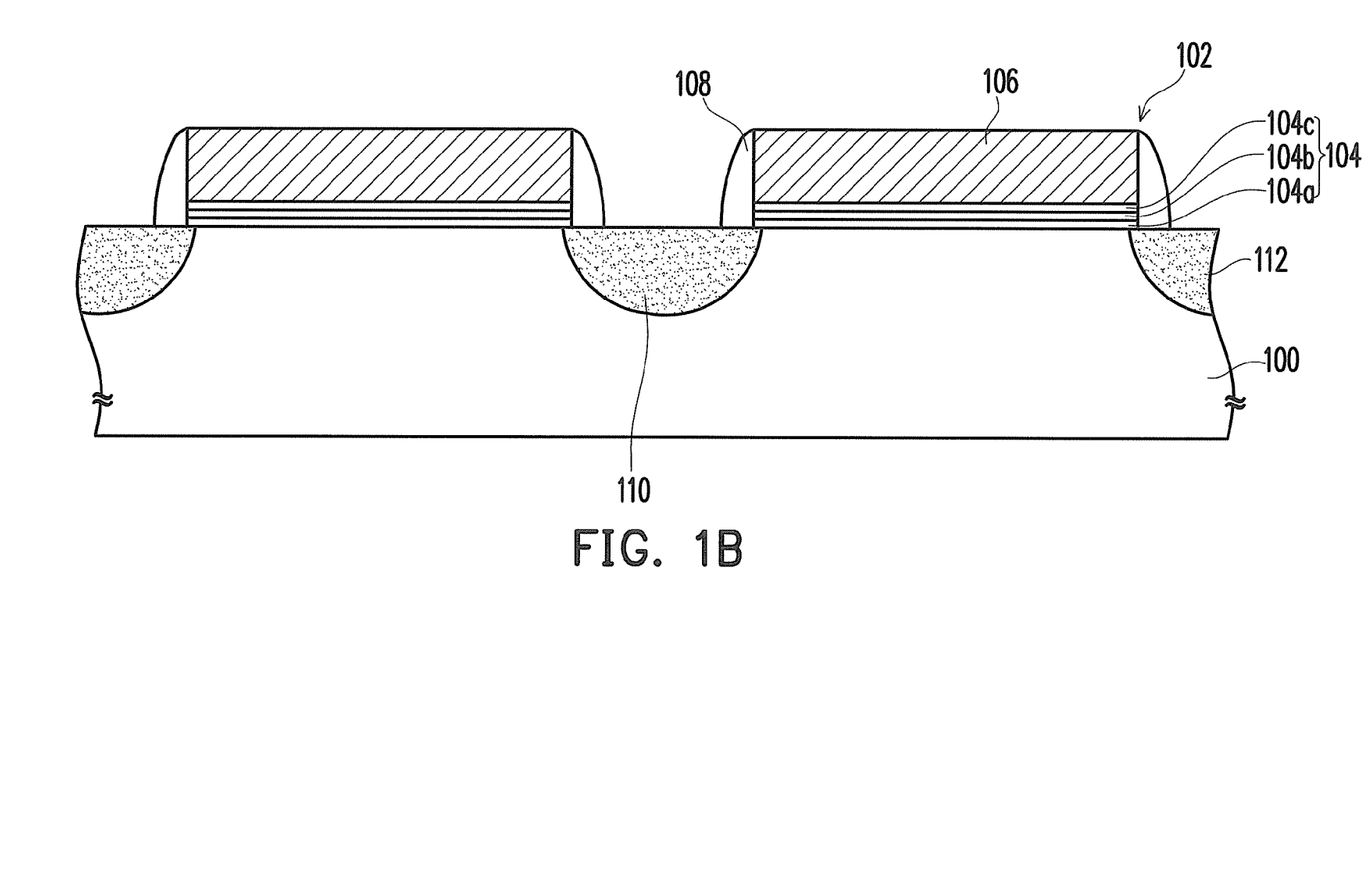

Referring to FIG. 1B, a spacer 108 is formed on sidewalls of the charge storage structure 104 and the gate 106. A formation of the spacer 108 includes the following, for example. A spacer material layer is conformally formed on the substrate 100. An anisotropic etching process is performed to remove a portion of the spacer material layer. The spacer 108 is manufactured with, for example, a oxide, a nitride, or combination of them. The charge storage structure 104, the gate 106, and the spacer 108 constitute a gate structure 102. Doped regions 110, 112 are formed in the substrate 100 at two sides of the charge storage structure 104. A formation of the doped regions 110, 112 includes the following, for instance. The gate 106 and the spacer 108 are used as a mask in a doping process, so as to implant a dopant required into the substrate 100. The dopant diffuses when implanted into the substrate 100. In the present embodiment, as the spacer 108 is formed on the sidewalls of the charge storage structure 104 and the gate 106, after the dopant is implanted using the gate 106 and the spacer 108 as a mask, the spacer becomes a buffer region to the implanted dopant diffusion. The dopant in the substrate 100 does not diffuse underneath the charge storage structure 104 in large amounts, but diffuses underneath the spacer 108 or diffuses underneath the charge storage structure 104 in very limited amounts. In other words, a distance between the doped regions 110, 112 formed (that is, a channel length of the memory) is not shortened greatly, such that the second bit effect generated during the operation of the memory is avoided.

Figure 1C:
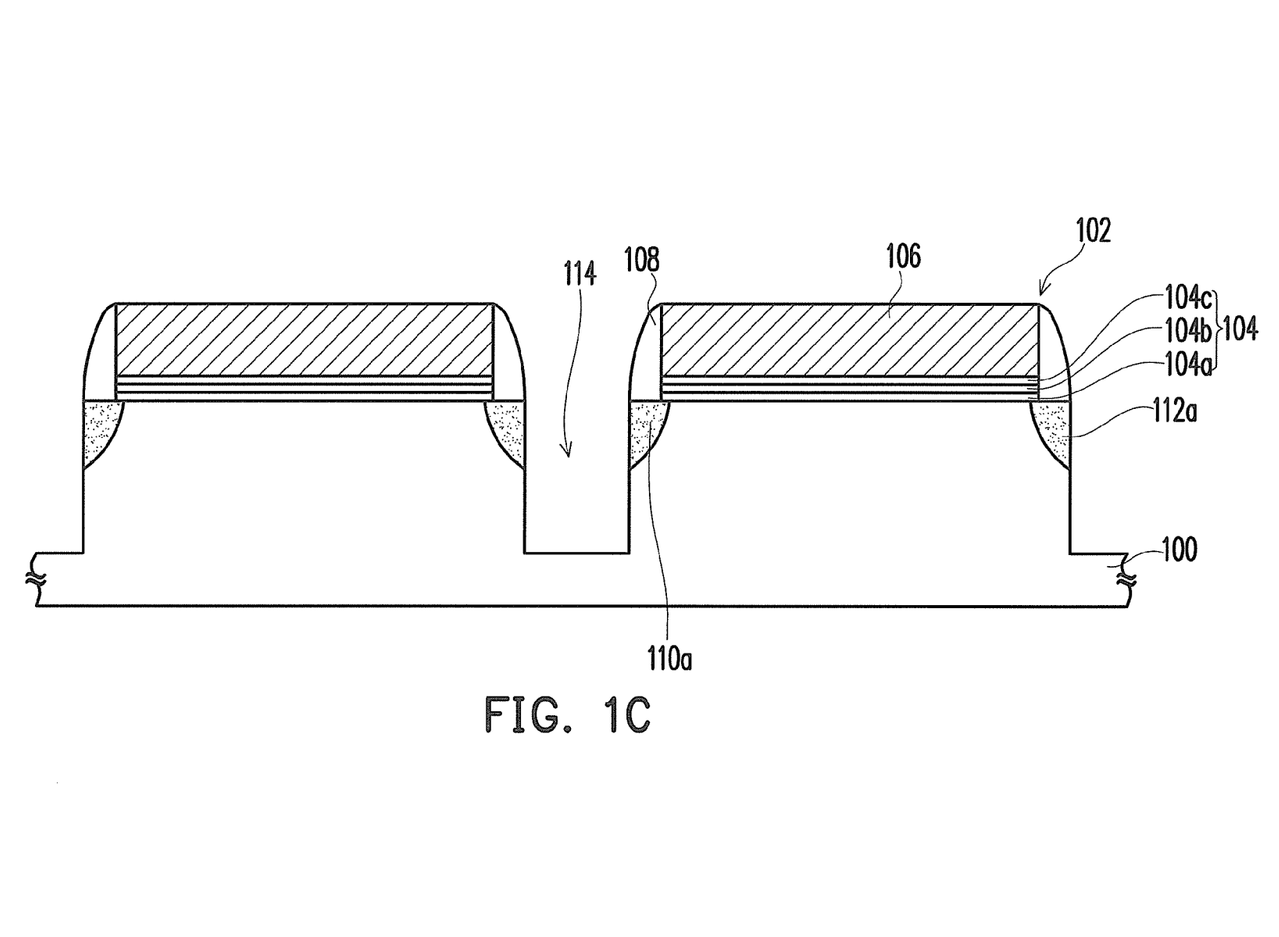

Referring to FIG. 1C, a trench 114 is formed in the substrate 100 at the two sides of the gate 106 and the spacer 108. A formation of the trench 114 includes the following, for example. The gate 106 and the spacer 108 are used as a mask to perform an anisotropic etching process for removing a portion of the substrate 100. Here, a depth of the trench 114 is greater than a depth of the doped regions 110, 112. In the process of removing a portion of the substrate 100, a portion of the doped regions 110, 112 is also removed at the same time, such that doped regions 110a, 112a located under the spacer 108 are remained.

Figure 1D:
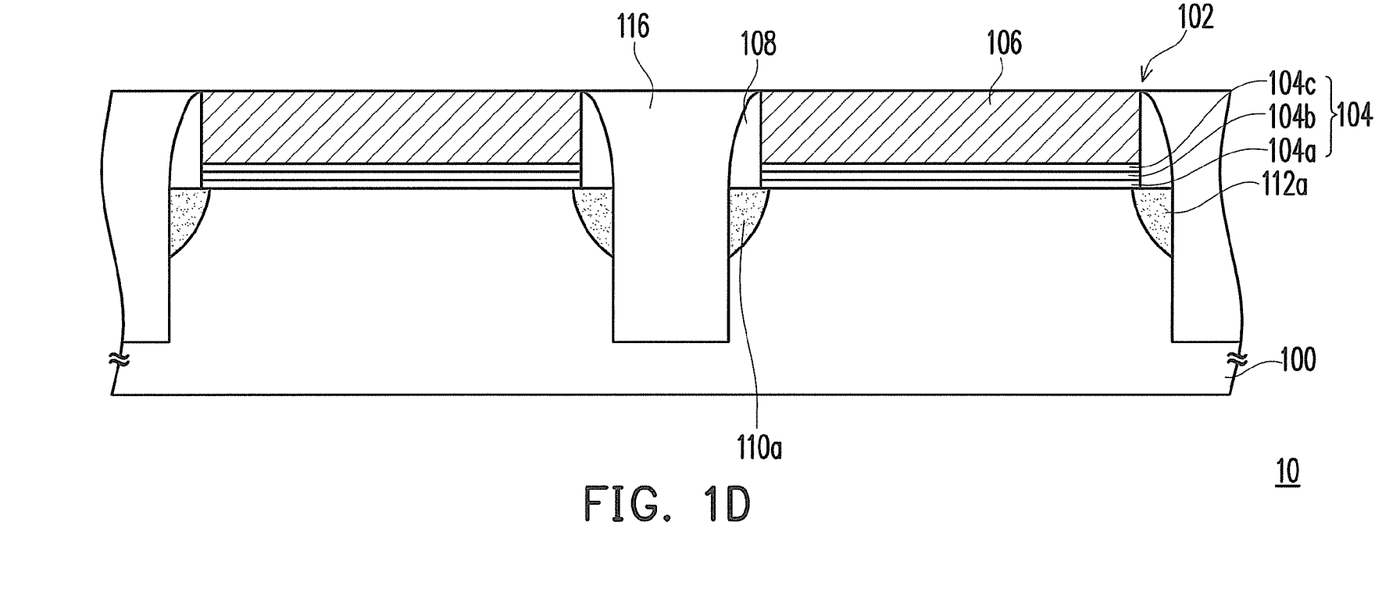

Referring to FIG. 1D, an isolation structure 116 is formed in the trench 114 to manufacture a non-volatile memory 10. A formation of the isolation structure 116 includes the following, for instance. An insulation material layer is formed on the substrate 100. The insulation material layer covers the gate 106 and the spacer 108 and fills the trench 114. A planarization process is performed to remove a portion of the insulation material layer until the gate 106 is exposed.

In the present embodiment, since the isolation structures 116 are formed in the substrate at the two sides of the gate structure 102 respectively, the program disturbance is prevented effectively when programming the non-volatile memory 10.

In the following, the non-volatile memory of the present embodiment is illustrated adopting FIG. 1D as an example.

Referring to FIG. 1D, the non-volatile memory 10 includes the substrate 100, the gate structure 102, the doped region 110a, the doped region 112a, and the pair of isolation structures 116. The gate structure 102 is disposed on the substrate 100. The gate structure 102 includes the charge storage structure 104, the gate 106, and the spacer 108. The charge storage structure 104 is disposed on the substrate 100. The charge storage structure 104 includes the dielectric layer 104a, the charge storage layer 104b, and the dielectric layer 104c. The dielectric layer 104a is disposed on the substrate 100 as the tunneling dielectric layer. The charge storage layer 104b is disposed on the dielectric layer 104a to store charges. The dielectric layer 104c is disposed on the charge storage layer 104b as a charge barrier layer. The gate 106 is disposed on the charge storage structure 104. The spacer 108 is disposed on sidewalls of the gate 106 and the charge storage structure 104. The doped region 110a and the doped region 112a are disposed in the substrate 100 at two sides of the charge storage structure 104 respectively and located under the spacer 108 and partially extend underneath the charge storage structure 104. The doped region 110a and the doped region 112a are adopted as a source region and a drain region respectively. In practice, the doped region 110a and the doped region 112a are also used as a drain region and a source region respectively. The pair of isolation structures 116 is disposed in the substrate 100 at two sides of the gate structure 102 respectively. The doped region 110a and the doped region 112a are located between the isolation structures 116. A depth of the isolation structures 116 is greater than a depth of the doped regions 110a and 112a.

In another embodiment, the doped regions 110a and 112a can also be located merely under the spacer 108.

Figure 2A:
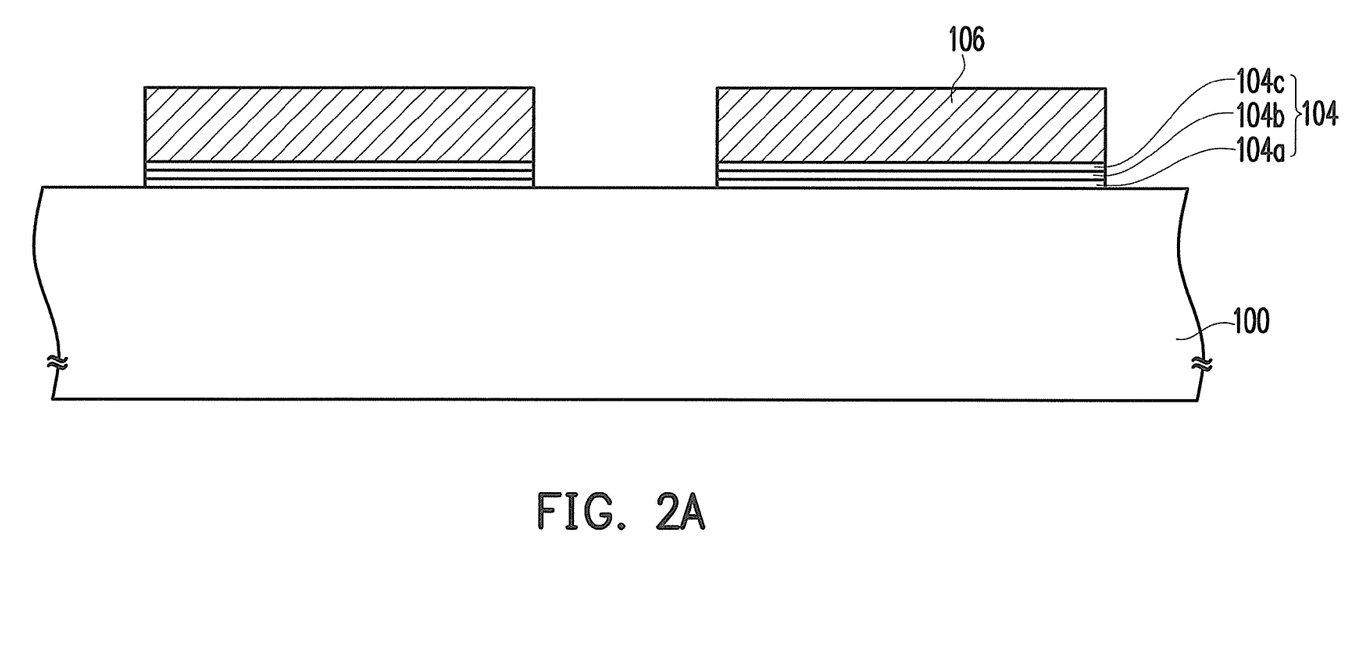
FIGS. 2A to 2D are cross-sectional views of a manufacturing flow chart of a non-volatile memory illustrated according to another embodiment of the invention.

FIGS. 2A to 2D are cross-sectional views of a manufacturing flow chart of a non-volatile memory illustrated according another embodiment of the invention. In the present embodiment, the same reference numerals refer to the same components as those in FIGS. 1A to 1D are denoted with the same notations and detailed descriptions are omitted hereinafter. Referring to FIG. 2A, a charge storage structure 104 and a gate 106 are formed on a substrate 100 sequentially. The charge storage structure 104 is a composite structure constituted by a dielectric layer 104a, a charge storage layer 104b, and a dielectric layer 104c.

Figure 2B:
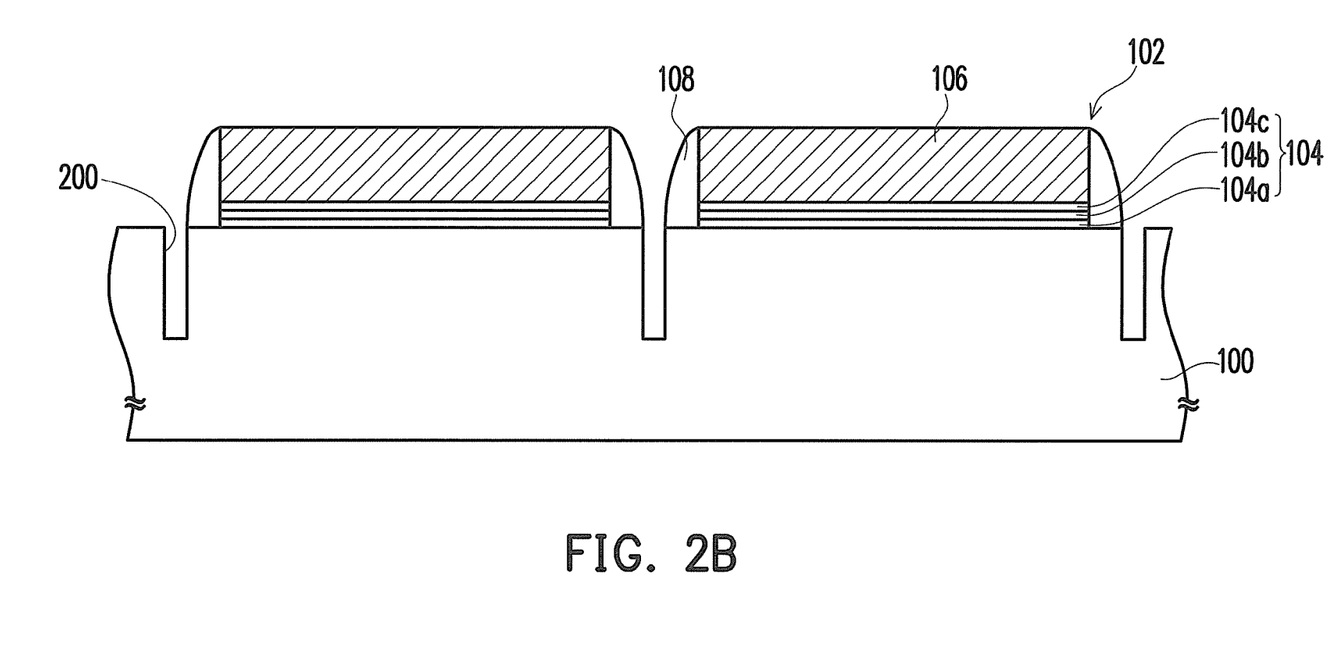

Referring to FIG. 2B, a spacer 108 is formed on sidewalls of the charge storage structure 104 and the gate 106. The charge storage structure 104, the gate 106, and the spacer 108 constitute a gate structure 102. A trench 200 is formed in the substrate 100 at two sides of the gate structure 102.

Figure 2C:
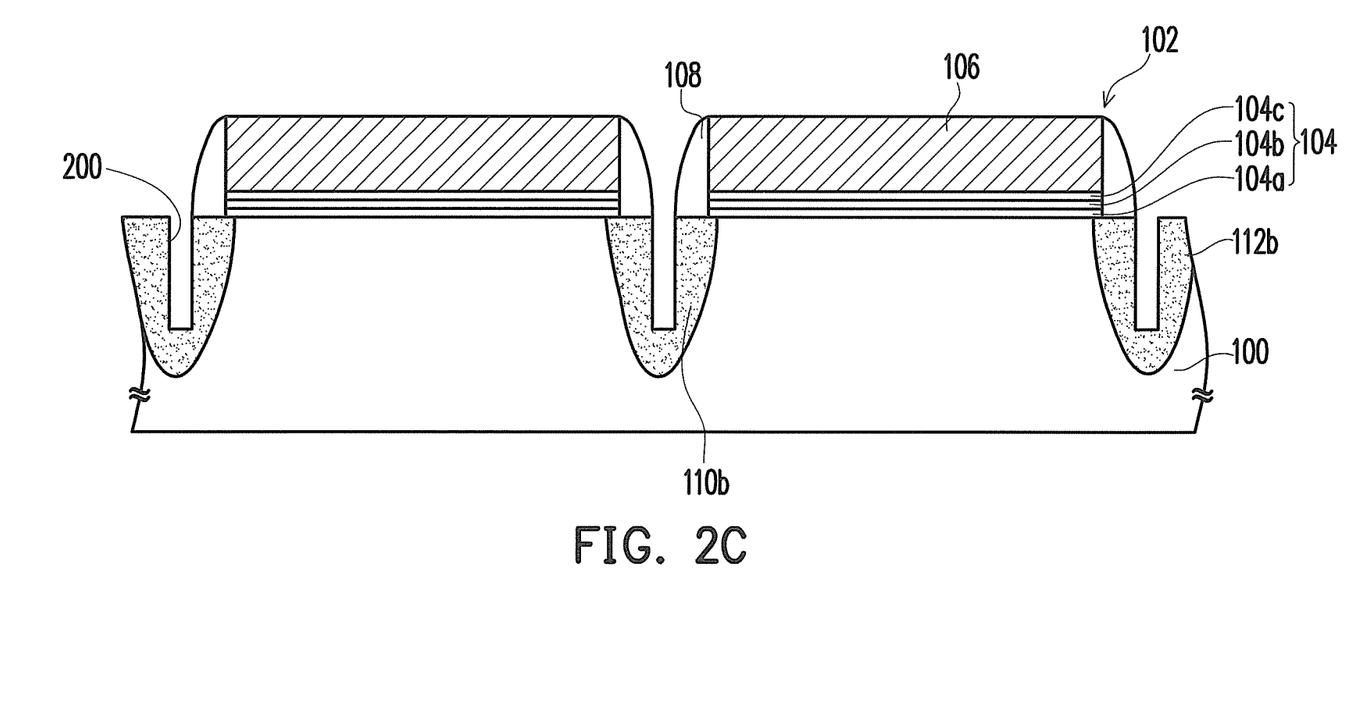

Referring to FIG. 2C, doped regions 110b, 112b are formed in the substrate 100 at two sides of the charge storage structure 104. A formation of the doped regions 110b, 112b includes the following, for instance. The gate 106 and the spacer 108 are used as a mask in a doping process, so as to implant a dopant required into sidewalls and the bottom of the substrate 200. Similarly, when the dopant is implanted, the spacer 108 becomes a buffer region to the implanted dopant diffusion. Some of the dopant in the substrate 100 diffuses underneath the spacer 108, or diffuses underneath the charge storage structure 104 in very limited amounts. Therefore, a distance between the doped regions 110b, 112b formed (that is, a channel length of the memory) is not shortened greatly, such that the second bit effect generated during the operation of the memory is avoided.

Figure 2D:
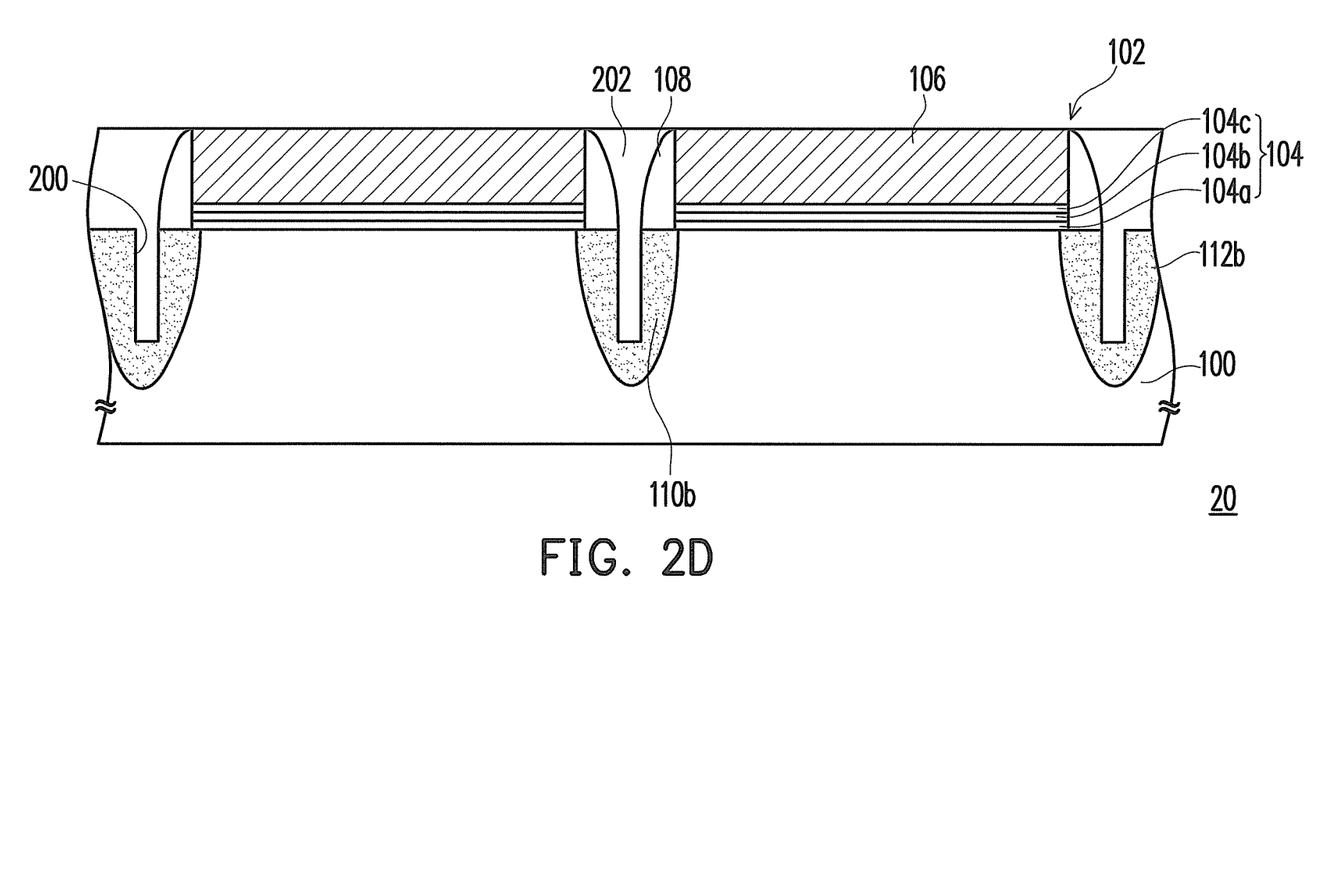

Referring to FIG. 2D, an isolation structure 202 is formed in the trench 200 to manufacture a non-volatile memory 20. A formation of the isolation structure 200 includes the following, for instance. An insulation material layer is formed on the substrate 100. The insulation material layer covers the gate 106 and the spacer 108 and fills the trench 200. A planarization process is performed to remove a portion of the insulation material layer until the gate 106 is exposed.

Similarly, in the present embodiment, since the isolation structures 202 are formed in the substrate at the two sides of the gate structure 102 respectively, the program disturbance is prevented effectively when programming the non-volatile memory 20.

In the following, the non-volatile memory of the present embodiment is illustrated adopting FIG. 2D as an example.

Referring to FIG. 2D, the differences between the non-volatile memory 20 and the non-volatile memory 10 include the following. In the non-volatile memory 10, the doped regions 110a and 112 are located between the isolation structures, and a depth of the isolation structures is greater than a depth of the doped regions 110a, 112a. In the non-volatile memory 20, the doped regions 110b, 112b surround one of the isolation structures 202 respectively and a depth of the doped regions 110b, 112b is greater than a depth of the isolation structures 202.

Similarly, in another embodiment, the doped regions 110b and 112b can also be located merely under the spacer 108.

It should be noted that in the embodiments above, the charge storage structure 104 is a composite structure constituted by a dielectric layer 104a, a charge storage layer 104b, and a dielectric layer 104c. In other embodiment, the structure of the charge storage structure can also be altered according to actual demands.

Figure 3:
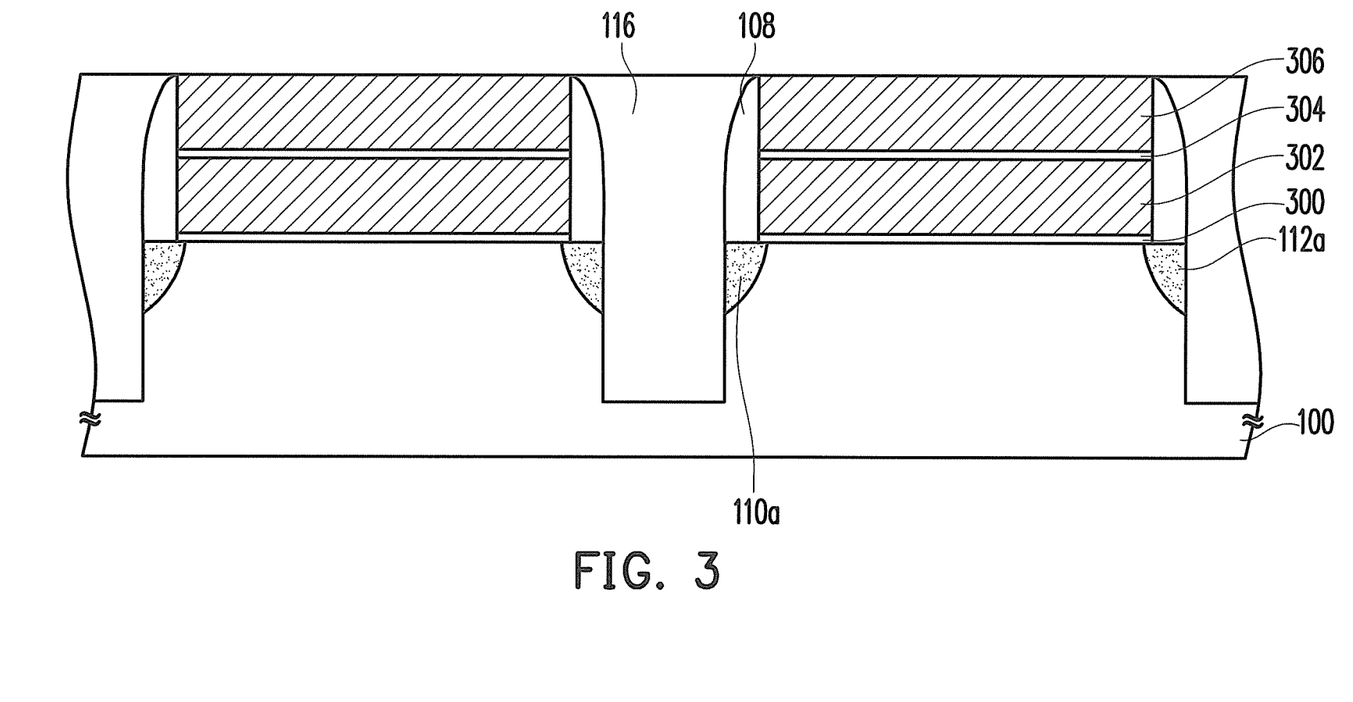
FIG. 3 is a cross-sectional views of a non-volatile memory illustrated according to another embodiment of the invention.
Figure 4:
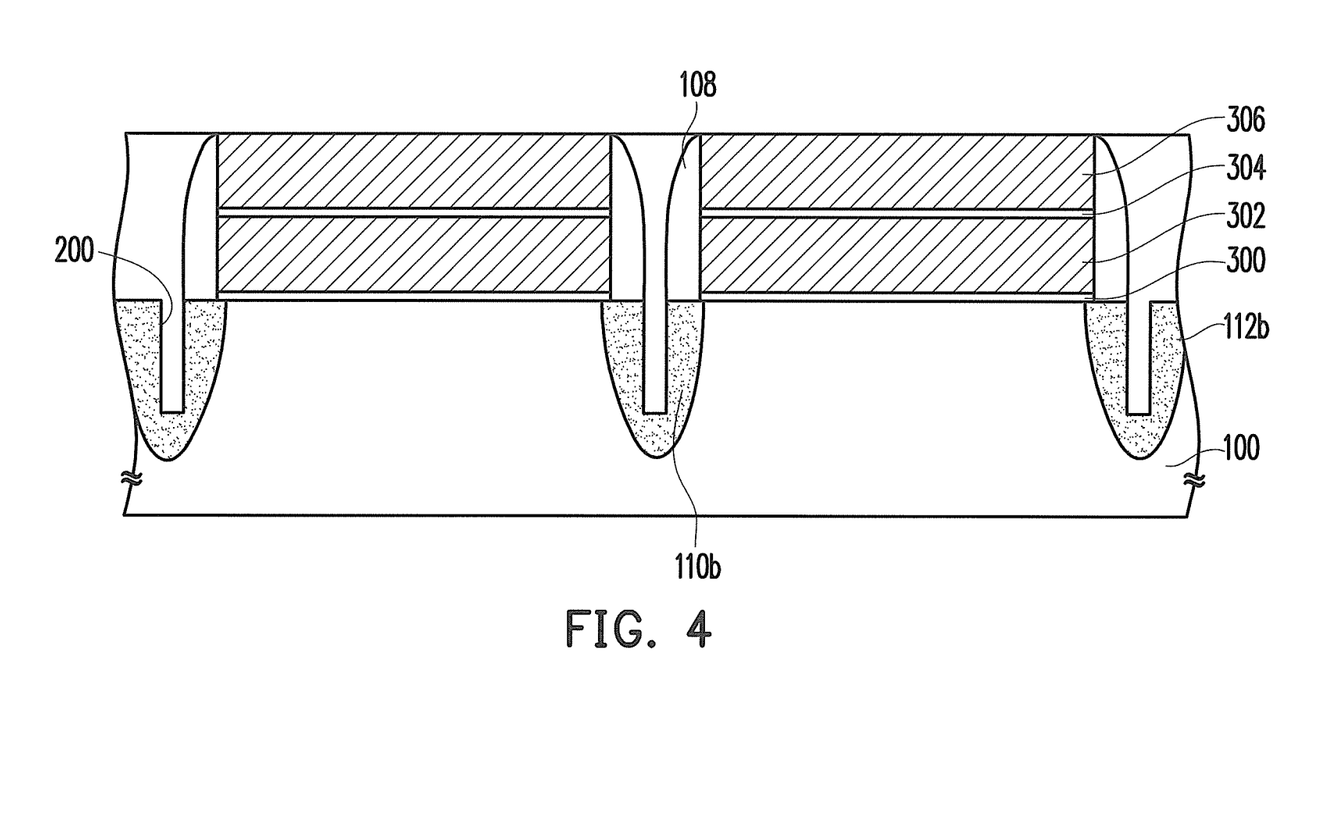
FIG. 4 is a cross-sectional views of a non-volatile memory illustrated according to another embodiment of the invention.

In another embodiment, the gate structure can also be a structure constituted by a tunneling dielectric layer, a floating gate, an inter-gate dielectric layer and a control gate. As shown in FIGS. 3 and 4, the tunneling dielectric layer 300 is disposed on the substrate 100. The floating gate 302 is disposed on the tunneling dielectric layer 300. The inter-gate dielectric layer 304 is disposed on the floating gate 302. The control gate 306 is disposed on the inter-gate dielectric layer 304. The spacer 108 is disposed on sidewalls of the tunneling dielectric layer 300, the floating gate 302, the inter-gate dielectric layer 304 and the control gate 306. The inter-gate dielectric layer 304, for example, is a composite structure constituted by oxide layer/nitride layer/oxide layer. The floating gate 302 is used as the charge storage structure.

In summary, in the embodiments of the invention, when the doped regions are formed, the gate and the spacer are utilized as a mask for the doping process. Therefore, when the dopant is implanted into the substrate, the spacer becomes a buffer region to the implanted dopant diffusion. Some of the dopant diffuses underneath of the spacer instead of merely diffusing underneath the charge storage structure. The length of the channel length of the memory is thus effectively prevented from shortening, so that the second bit effect generated during the operation of the memory is avoided and the operation window is enlarged.

Furthermore, in the non-volatile memory of the embodiments of the invention, since the isolation structures are disposed in the substrate at the two sides of the gate structure, the program disturbance is prevented effectively when programming the non-volatile memory.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A non-volatile memory, comprising:
   a substrate:
   a gate structure, disposed on the substrate and comprising:
   a charge storage structure disposed on the substrate;
   a gate, disposed on the charge storage structure; and
   a spacer, disposed on a sidewall of each of the gate and the charge storage structure;
   a first doped region and a second doped region, disposed in the substrate at two sides of the charge storage structure respectively and at least located under the spacer; and
   first and second isolation structures, disposed in the substrate at two sides of the gate structure respectively, wherein upper surfaces of the gate, the spacer, and the first and second isolation structures are at the same level, wherein the first doped region contacts a sidewall of the first isolation structure and is not disposed under a bottom surface of the first isolation structure, and the second doped region contacts a sidewall of the second isolation structure and is not disposed under the bottom surface of the first isolation structure;
   the first and second isolation structures comprise insulation material layers.

2. The non-volatile memory as claimed in claim 1, wherein the first doped region and the second doped region are located between the first and second isolation structures, and a depth of the first and second isolation structures is greater than a depth of the first doped region and the second doped region.

3. The non-volatile memory as claimed in claim 1, wherein the charge storage structure comprises:
   a first dielectric layer, disposed on the substrate;
   a charge storage layer, disposed on the first dielectric layer; and
   a second dielectric layer, disposed on the charge storage layer.

4. The non-volatile memory as claimed in claim 3, wherein a material of the charge storage layer comprises a nitride.

5. The non-volatile memory as claimed in claim 1, wherein the charge storage structure is a floating gate, and the gate is a control gate, and the gate structure further comprises:
   a tunneling dielectric layer, disposed between the substrate and the floating gate; and
   an inter-gate dielectric layer, disposed between the floating gate and the control gate,
   wherein the spacer is disposed on sidewalls of the tunneling dielectric layer, the floating gate, the inter-gate dielectric layer and the control gate.

6. The non-volatile memory as claimed in claim 5, wherein the inter-gate dielectric layer is a composite structure constituted by oxide layer/nitride layer/oxide layer.

7. A non-volatile memory, comprising:
   a substrate;
   two gate structures, disposed on the substrate, wherein each of the gate structures comprises:
   a charge storage structure disposed on the substrate;
   a gate, disposed on the charge storage structure; and
   a spacer, disposed on sidewalls of the gate and the charge storage structure;
   a doped region, disposed in the substrate between the two gate structures; and
   an isolation structure, disposed in the doped region, wherein the doped region contacts a sidewall of the isolation structure and is not disposed under a bottom surface of the isolation structure, wherein upper surfaces of the gate, the spacer, and the isolation structure are at the same level; and
   the isolation structure comprises an insulation material layer.

8. The non-volatile memory as claimed in claim 7, wherein a depth of the isolation structure is greater than a depth of the doped region.

9. The non-volatile memory as claimed in claim 7, wherein the charge storage structure comprises:
   a first dielectric layer, disposed on the substrate;
   a charge storage layer, disposed on the first dielectric layer; and
   a second dielectric layer, disposed on the charge storage layer.

10. The non-volatile memory as claimed in claim 9, wherein a material of the charge storage layer comprises a nitride.

11. The non-volatile memory as claimed in claim 7, wherein each of the charge storage structures is a floating gate, each of the gates is a control gate, and each of the gate structures further comprises:
    a tunneling dielectric layer, disposed between the substrate and the floating gate; and
    an inter-gate dielectric layer, disposed between the floating gate and the control gate.

12. The non-volatile memory as claimed in claim 11, wherein the inter-gate dielectric layer is a composite structure constituted by oxide layer/nitride layer/oxide layer.

* * * * *